US008513515B1

(12) United States Patent
Gu (10) Patent No.: US 8,513,515 B1
(45) Date of Patent: Aug. 20, 2013

(54) GENERATING ALTERNATING CURRENT FROM CONCENTRATED SUNLIGHT

(76) Inventor: Bingwu Gu, Elk Grove, CA (US)

(*) Notice: Subject to any disclaimer, the term of this patent is extended or adjusted under 35 U.S.C. 154(b) by 1028 days.

(21) Appl. No.: 12/584,051

(22) Filed: Aug. 27, 2009

Related U.S. Application Data (60) Provisional application No. 61/094,113, filed on Sep. 4, 2008, provisional application No. 61/094,115, filed on Sep. 4, 2008, provisional application No. 61/094,117, filed on Sep. 4, 2008, provisional application No. 61/094,120, filed on Sep. 4, 2008.

(51) Int. Cl.
*H01L 31/042* (2006.01)

(52) U.S. Cl.
USPC .......................................... 136/246; 136/259

(58) Field of Classification Search
USPC .................................. 136/246, 259
See application file for complete search history.

(56) References Cited

U.S. PATENT DOCUMENTS

| | | | |
|---|---|---|---|
| 3,511,559 A | 5/1970 | Foster | |
| 4,075,034 A | 2/1978 | Butler | |
| 4,297,000 A | 10/1981 | Fries | |
| 4,306,769 A | 12/1981 | Martinet | |
| 4,307,936 A | 12/1981 | Ochiai | |
| 4,389,085 A | 6/1983 | Mori | |
| 4,411,490 A | 10/1983 | Daniel | |
| 4,425,905 A | 1/1984 | Mori | |
| 4,500,167 A | 2/1985 | Mori | |
| 4,511,755 A | 4/1985 | Mori | |
| 4,525,031 A | 6/1985 | Mori | |
| 4,539,625 A | 9/1985 | Bornstein | |
| 4,572,613 A | 2/1986 | Mori | |
| 4,577,052 A | 3/1986 | Schutten | |
| 4,700,013 A | 10/1987 | Soule | |
| 5,022,736 A | 6/1991 | Mori | |
| 5,175,967 A | 1/1993 | Greenwood | |
| 5,371,660 A | 12/1994 | Levens | |
| 5,581,447 A | 12/1996 | Raasakka | |
| 6,057,504 A | 5/2000 | Izumi | |
| 6,128,135 A | 10/2000 | Stiles | |
| 6,178,707 B1* | 1/2001 | Bengtson | 52/200 |
| 6,299,317 B1 | 10/2001 | Gorthala | |
| 6,603,069 B1 | 8/2003 | Muhs | |
| 6,750,391 B2 | 6/2004 | Bower | |
| 6,774,299 B2 | 8/2004 | Ford | |
| 6,840,645 B2 | 1/2005 | Eisenman | |
| 7,141,734 B1 | 11/2006 | Fork | |
| 7,190,531 B2 | 3/2007 | Dyson | |
| 7,231,128 B2 | 6/2007 | Muhs | |
| 7,295,372 B2 | 11/2007 | Steneby | |
| 7,339,739 B1 | 3/2008 | Kinney | |
| 2006/0274439 A1* | 12/2006 | Gordon et al. | 359/859 |
| 2008/0245401 A1* | 10/2008 | Winston et al. | 136/246 |
| 2008/0266664 A1* | 10/2008 | Winston et al. | 359/592 |
| 2009/0199892 A1* | 8/2009 | Farquhar | 136/248 |
| 2009/0308377 A1* | 12/2009 | Kleinwaechter | 126/605 |

\* cited by examiner

*Primary Examiner* — Golam Mowla
(74) *Attorney, Agent, or Firm* — Gerald R Prettyman

(57) ABSTRACT

An alternating current (AC, or ac) solar electric power generation system includes a primary concentrator to concentrate sunlight, one optional reflector to redirect the concentrated sunlight, a concentrating solar PV (CPV) module, a rotary electric connector, and a motor with an optional gearbox to spin the CPV module. The photovoltaic cells produce a varying electric output that is transmitted to the stationary contact by the rotary connector. Two groups of solar cells installed in the opposite direction with a phase difference of 180 degrees generate the one-phase AC electric power. An air and water mist, or other coolant system may cool the solar cells.

13 Claims, 13 Drawing Sheets

GENERATING ALTERNATING CURRENT FROM CONCENTRATED SUNLIGHT

CROSS-REFERENCE TO RELATED APPLICATIONS

This application claims the benefit of priority of U.S. Provisional Application Ser. No. 61/094,117 titled "Low Numerical Aperture (Low-NA) Solar Lighting System" filed Sep. 4, 2008, which is hereby incorporated by reference. This application also claims the benefit of priority of U.S. Provisional Application Ser. No. 61/094,113 titled "One-axis tracking concentrating photovoltaic and solar hot water hybrid system" filed Sep. 4, 2008, which is hereby incorporated by reference. This application also claims the benefit of priority of U.S. Provisional Application Ser. No. 61/094,115 titled "Alternating current electricity generation from concentrated sunlight" filed Sep. 4, 2008, which is hereby incorporated by reference. This application also claims the benefit of priority of U.S. Provisional Application Ser. No. 61/094,120 titled "Solar lighting system with one-axis tracking" filed Sep. 4, 2008, which is hereby incorporated by reference. This application is related to co-pending U.S. patent application Ser. No. 12/584,052, titled "LOW NUMERICAL APERTURE (LOW-NA) SOLAR LIGHTING SYSTEM," filed Aug. 27, 2009, and co-pending U.S. patent application Ser. No. 12/584,050, titled "CONCENTRATED PHOTOVOLTAIC AND SOLAR HEATING SYSTEM," filed Aug. 27, 2009, both of which are incorporated by reference.

BACKGROUND

1. Field of Invention

This invention relates to the field of solar photovoltaic systems, specifically to the generation of alternating electric power using concentrated sunlight.

2. Related Art

The use of the photovoltaic cells to generate electric power from solar radiation is a major part of the solar energy application. However, the solar photovoltaic cells generate Direct Current electric power. For many applications, the Direct Current electric power must be converted to Alternating Current before the electrical can be used. The DC-to-AC conversion needs an expensive power inverter, which makes up a significant portion of the total cost of the solar electric system. The inverter also consumes power and lowers the system efficiency.

SUMMARY OF THE INVENTION

Systems and method provide for a solar electric alternating current (AC, or ac) power generator. The system may include a primary sunlight concentrator to concentrate sunlight, a concentrating photovoltaic module, a rotary connector, and a motor with gearbox to spin the solar module against the concentrated sunlight. The primary sunlight concentrator may be a parabolic concentrator or a Fresnel lens. A secondary sunlight concentrator may direct sunlight to an optical homogenizer, which directs the concentrated sunlight to a solar AC generator.

Multiple solar cells rotate in tandem connected to a rotary connector with a stationary output post. The relative motion between the photovoltaic cells and the concentrated sunlight causes the solar irradiance on each solar cell to produce an electric current with varying amplitude and polarity. The total effect of the system is that the concentrated sunlight generates alternating current without an electric inverter.

The solar cells may be cooled to offset heat from the concentrated sunlight and generated current. The cooling method may include an evaporative mist near the top and bottom of the solar cells, or a temperature controlled bath.

BRIEF DESCRIPTION OF THE DRAWINGS

Elements in the figures are illustrated for simplicity and clarity and are not drawn to scale. The dimensions of some of the elements may be exaggerated relative to other elements to help improve the understanding of various embodiments of the invention.

DETAILED DESCRIPTION OF THE INVENTION

Figure 1:
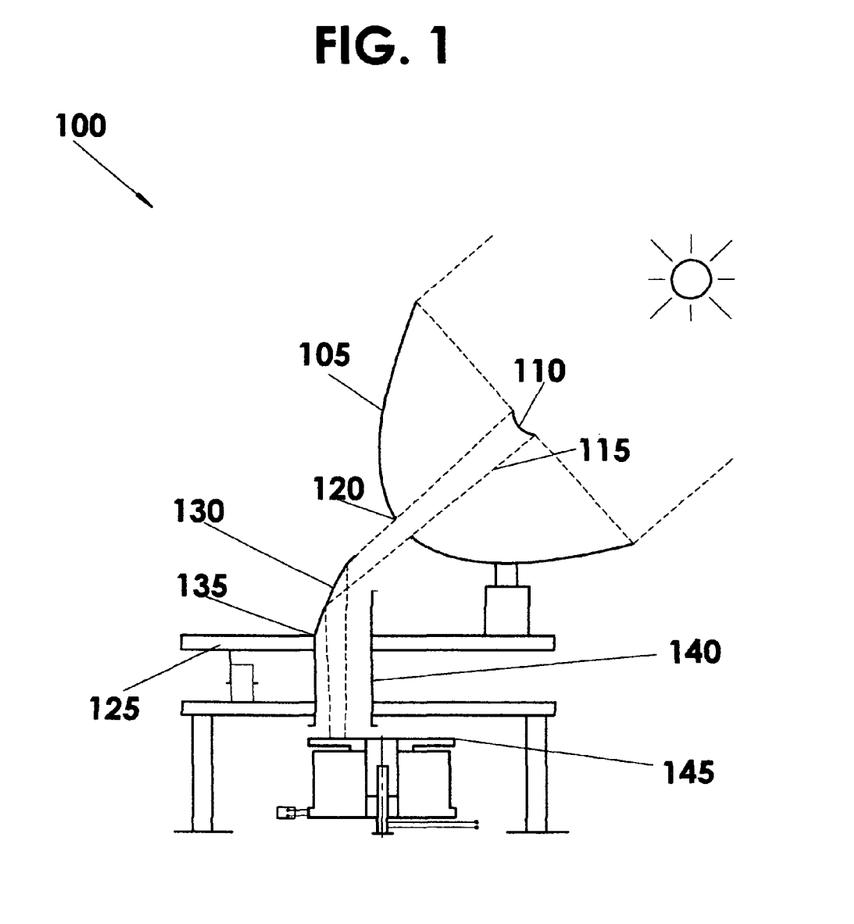
FIG. 1 shows an embodiment of the system for generating alternating current from concentrated sunlight.

FIG. 1 shows an embodiment of the system for generating alternating current from a concentrated sunlight. The embodiment may comprise a primary sunlight concentrator 105, a secondary sunlight concentrator 110, concentrated sunlight 115, an aperture 120, a solar tracker 125, a reflector 130, a hinge 135, an optical homogenizer 140, and a rotary solar AC generator 145.

The primary sunlight concentrator 105 concentrates the incoming sunlight by directing the incoming sunlight toward a common focal point. In some embodiments, a secondary sunlight concentrator 110 is at the common focal point to receive the incoming sunlight. Although the secondary light concentrator 110 does not collimate the light, the secondary light concentrator 110 keeps the concentrated sunlight convergent and directs it toward aperture 120. The concentrated light 115 then exits the primary light concentrator 105 via aperture 120.

Tracking the sunlight is a solar tracker 125, which is connected to the primary light concentrator 105 to assure that the primary light concentrator 105 is optimally oriented at all times toward the sun. In one embodiment, the solar tracker 125 monitors both the azimuth and elevation of the sun with a dual axis motor system, continuously aligns the primary light concentrator 105 to directly face the sun. In some embodiments, the solar tracker 125 may be single axis system. Other embodiments may simply track the sun without aligning the primary light concentrator 105, or omit the solar tracker 125.

After passing through aperture 120, the concentrated light 115 strikes the reflector 130. The reflector 130 may comprise a high-power high-reflectivity mirror. The reflector 130 may be flat or other shape. The reflector 130 may be attached to the primary concentrator 105 and to a hinge 135. The reflector 130 may be set near 45 degrees from the horizontal plane when the solar elevation angle is 0 degree. The reflector 130 may be set near 90 degrees from the horizontal plane, which is vertical, when the solar elevation angle is 90 degrees. The hinge 135 is connected to the sunlight homogenizer 140. A filter may be present to remove infrared radiation and/or ultraviolet light.

The reflector 130 reflects the concentrated sunlight 115 into the sunlight homogenizer 140. The optical homogenizer 140 may be a light tube. The optical homogenizer 140 may have an average reflectivity of over 98%. The optical homogenizer 140 may be fabricated with highly reflective aluminum sheet. The sunlight homogenizer 140 may be manufactured with different diameters, such as 2", 3", 5", etc. The optical homogenizer 140 may be more sophisticated, but may be more expensive. On passing through the optical homogenizer 140, the concentrated sunlight 115 enters the rotary solar AC generator 145.

Figure 2:
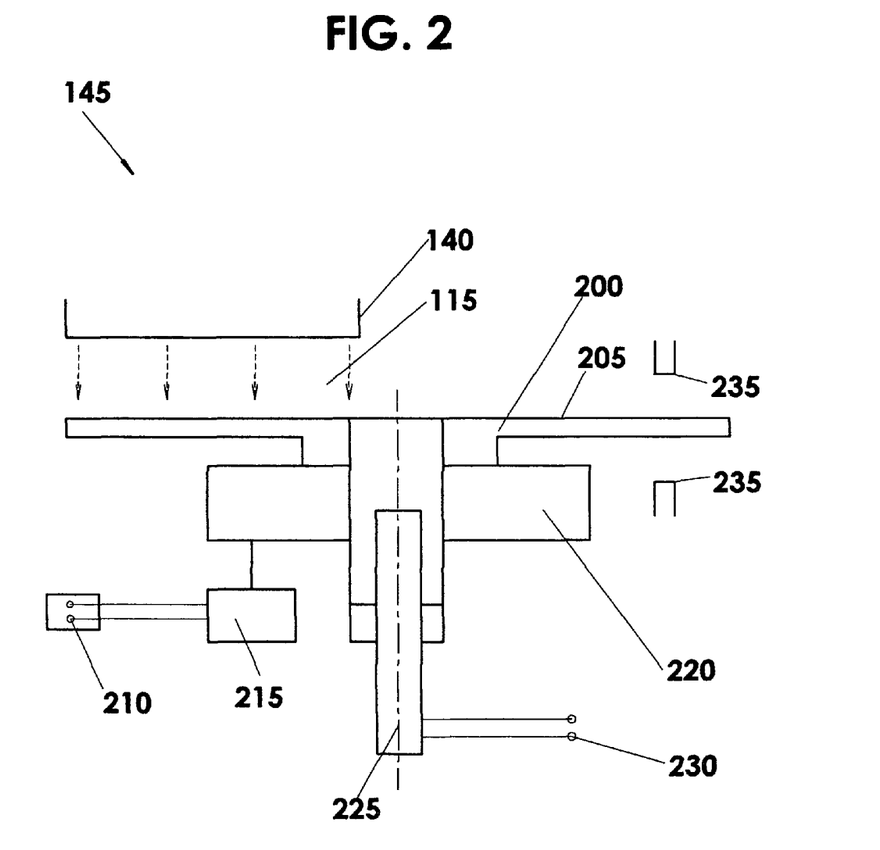
FIG. 2 shows details of the solar AC generator.

FIG. 2 shows details of the rotary solar AC generator 145. The rotary solar AC generator 145 may comprise a rotary motion stage 200, a plurality of concentrated photovoltaic cells 205, a motor power supply 210, a motor 215, a gearbox 220, a rotary electrical connector 225, an alternating output connector 230, and a concentrated photovoltaic cell cooling system 235.

Beneath the optical homogenizer 140 is the rotary motion stage 200 supporting the concentrated photovoltaic cells 205. The rotary motion stage 200 may be round or any shape configured for supporting the concentrated photovoltaic cells 205. For example, if the concentrated photovoltaic cells 205 are square, the rotary motion stage 200 might be square to properly support the plurality concentrated photovoltaic cells 205.

To take proper effect of the concentrated sunlight from the optical homogenizer 140, each of the concentrated photovoltaic cells 205 may be approximately the same size as the outlet of the optical homogenizer 140. The rotary motion stage 200 may be sized to hold the concentrated photovoltaic cells 205.

Beneath the rotary motion stage 200 is the rotational driving mechanism of the rotary motion stage 200. The rotational driving mechanism comprises a motor power supply 210, a motor 215, and a gearbox 220.

The motor power supply 210 supplies power to the motor 215. The motor power supply 210 may be a battery for an electrical motor. In some embodiments, the motor power supply 210 may be an alternative source, e.g., mechanical or electrical, for driving the motor 215, thus creating 'green (renewable) power'.

A gearbox 220 may be used to adapt the speed and torque of the motor 215 for rotating the rotary motion stage 200. The rotary movement of the rotary motion stage 200 may be adjusted to match the desired frequency of the resultant alternating current, such as 60 cycles per second, 50 cycles per second, or whatever frequency is desired.

Electrically coupled to each of the concentrated photovoltaic cells 205 is the rotary electrical connector 225. The rotary electrical connector 225 collects the current from the plurality concentrated photovoltaic cells 205 and transmits the current to the alternating output connector 230. The rotary electrical connector 225 may be a MERCOTAC® brand low resistance rotary electrical connector. One end of the rotary electrical connector 225 may be fixed to the center of the rotary motion stage 200. The rotating side connecting wires of the rotary electrical connector 225 are connected to the concentrated photovoltaic cells 205. The stationary side connecting wires of the rotary electrical connector 225 are connected to the alternating output connector 230. As the concentrated photovoltaic cells 205 rotate under the optical homogenizer 140, they generate alternating current, as described herein. Some embodiments may include rectifiers to avoid back current to the concentrated photovoltaic cells 205.

The concentrated photovoltaic cells 205 may heat-up from the solar heat of the concentrated sunlight 115 and from the generated current. The concentrated photovoltaic cell cooling system 235 near the top or bottom or both of the CPV cells 205 serves to cool the plurality concentrated photovoltaic cells 205. In some embodiments, the concentrated photovoltaic cell cooling system 235 may be an evaporative air and water mist. In some embodiments, the concentrated photovoltaic cell cooling system 235 may be a nonconductive mist. In some embodiments, the concentrated photovoltaic cell cooling system 235 may be a temperature-controlled nonconductive liquid bath.

Figure 3:
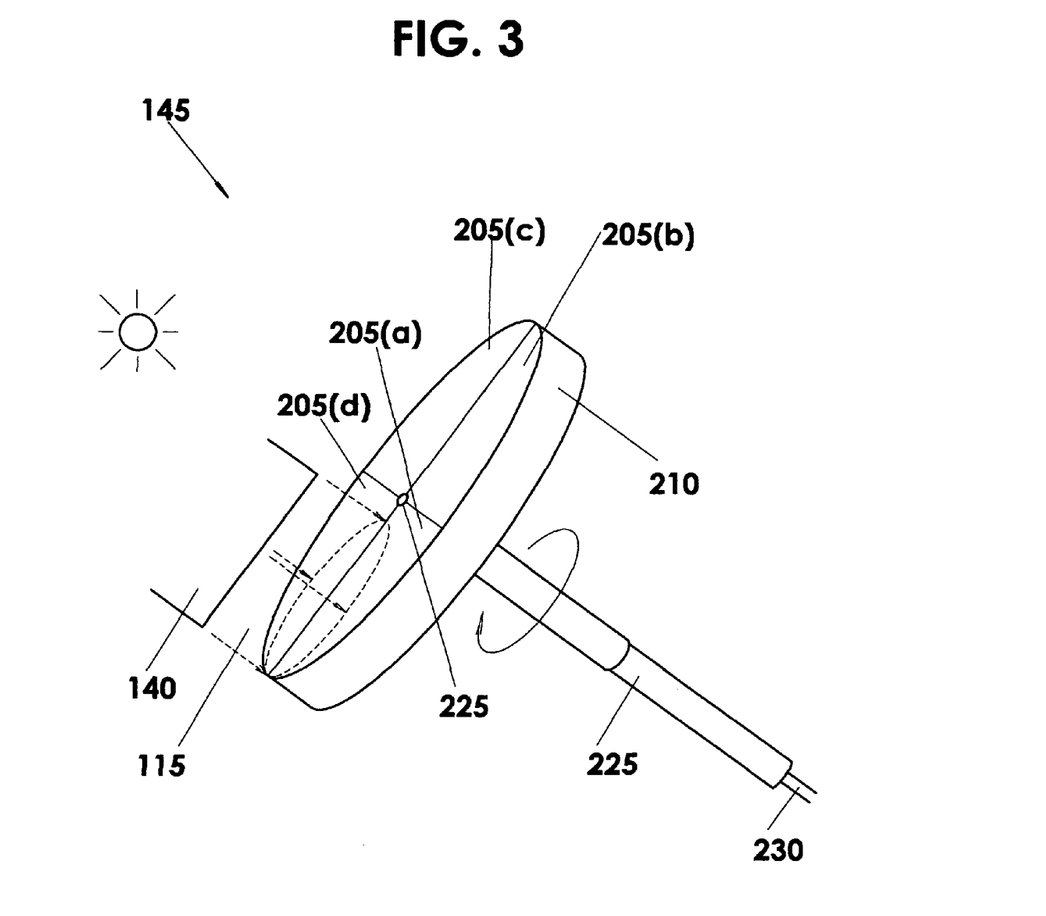
FIG. 3 shows a representative motion of the solar AC generator.

FIG. 3 shows a representative motion of the rotary solar AC generator 145. In this embodiment, there are two concentrating photovoltaic cells 205. In some embodiments, there may be a plurality of pairs of the plurality concentrating photovoltaic cells 205. The concentrated photovoltaic cells 205 are high efficiency models.

In this representation, the rotary motion 200 is shown turning counter-clockwise. Turning the rotary motion stage 200 is the motor 215 and optionally, the gearbox 220 (shown in FIG. 2). In some embodiments, the rotary motion stage 200 may be turning clockwise. The direction of rotation does not affect the output electric power.

The rotary electrical connector 225 collects the electrical power generated by the concentrating photovoltaic cells 205, and transmits the power to the alternating output connector 230.

Figure 4:
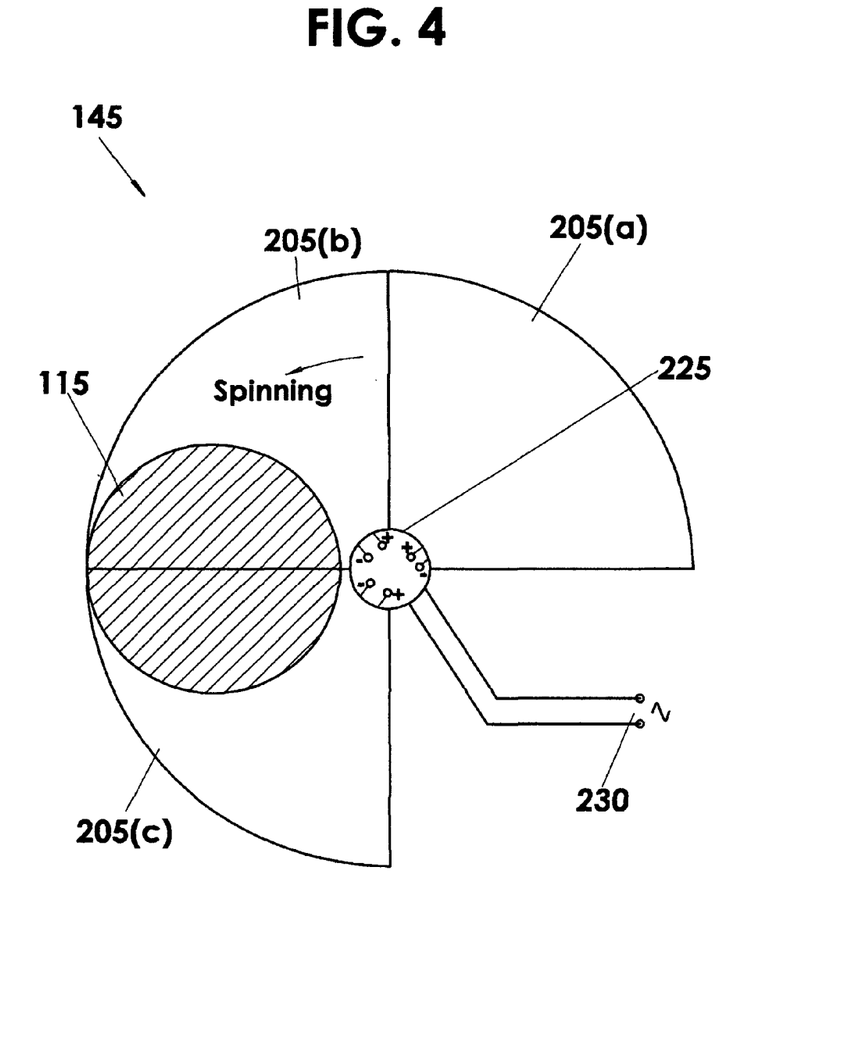
FIG. 4 shows a representative electrical connection for the solar AC generator.

FIG. 4 shows a representative electrical connection for the rotary solar AC generator 145. In this representation, there are two concentrating photovoltaic cells 205 across from each other to show opposition of their electrical connection to the rotary electrical connector 225.

As each of the at least two concentrating photovoltaic cells 205 rotates under the optical homogenizer 140 (FIG. 3), it enters and exits the concentrated sunlight 115. While subject to the concentrated sunlight 115, the concentrating photovoltaic cell 205 generates direct current, i.e. in one polarity. As the opposing terminals of each of the concentrating photovoltaic cells 205 are connected to the same post, one of the concentrating photovoltaic cells 205 generates current of one polarity, while the other concentrating photovoltaic cell 205 generates current of opposing polarity. Furthermore, the amplitude of current generated is a function of the area of the each concentrating photovoltaic cell 205 under the optical homogenizer 140.

Consequently, the concentrating photovoltaic cells 205 generate alternating current as the concentrated photovoltaic cells 205 rotate in the concentrated sunlight 115 under the optical homogenizer 140. In some embodiments, there may be a plurality of pairs of the plurality concentrating photovoltaic cells 205 producing single-phase alternating current, two-phase alternating current, etc.

Figure 5:
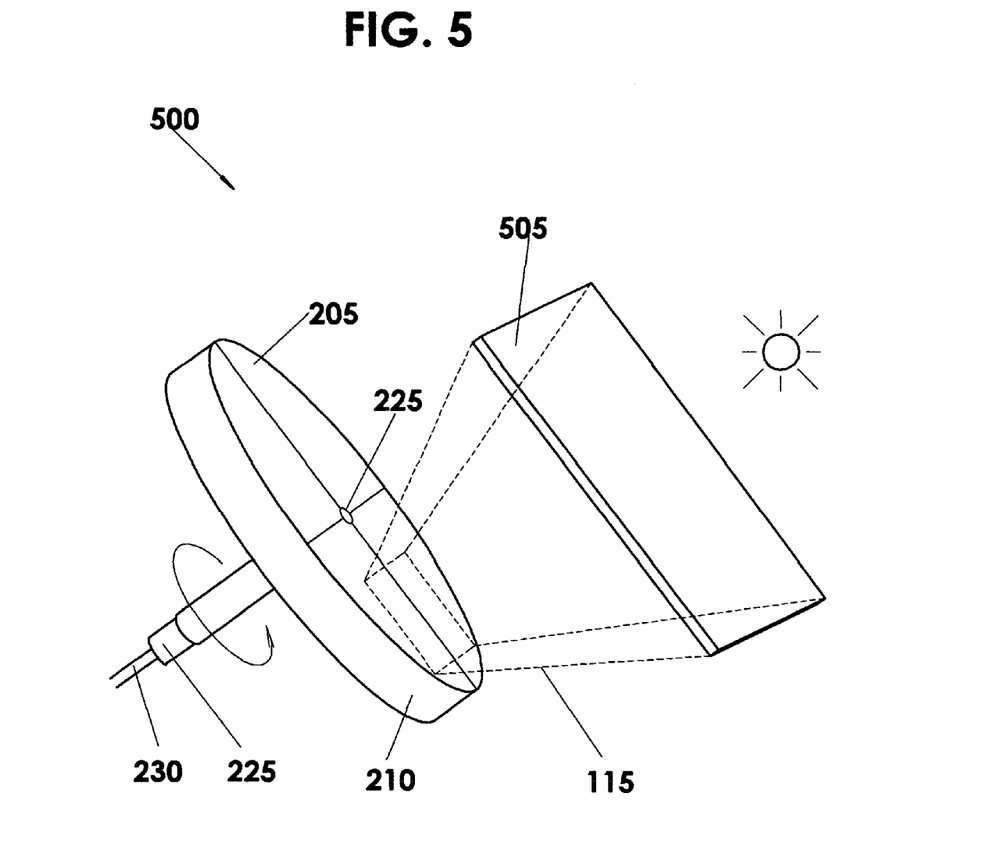
FIG. 5 shows another embodiment of the system for generating alternating current from concentrated sunlight.

FIG. 5 shows another embodiment 500 of the system for generating alternating current from concentrated sunlight. Embodiment 500 may comprise the same elements as embodiment 100, including the solar tracker 125, except that a Fresnel lens 505 replaces the primary sunlight concentrator 105. Similarly, the secondary sunlight concentrator 110, the aperture 120, the reflector 130, the hinge 135, and the optical homogenizer 140 are not needed.

The Fresnel lens 505 includes a substantially polygonal focusing portion adapted to focus the incoming sunlight directly onto the concentrating photovoltaic cells 205. The function and operation of the embodiment 500 pertaining to the rotary solar AC generator 145 is as described above. The concentrated photovoltaic cell cooling system 235 may also be present.

Figure 6:
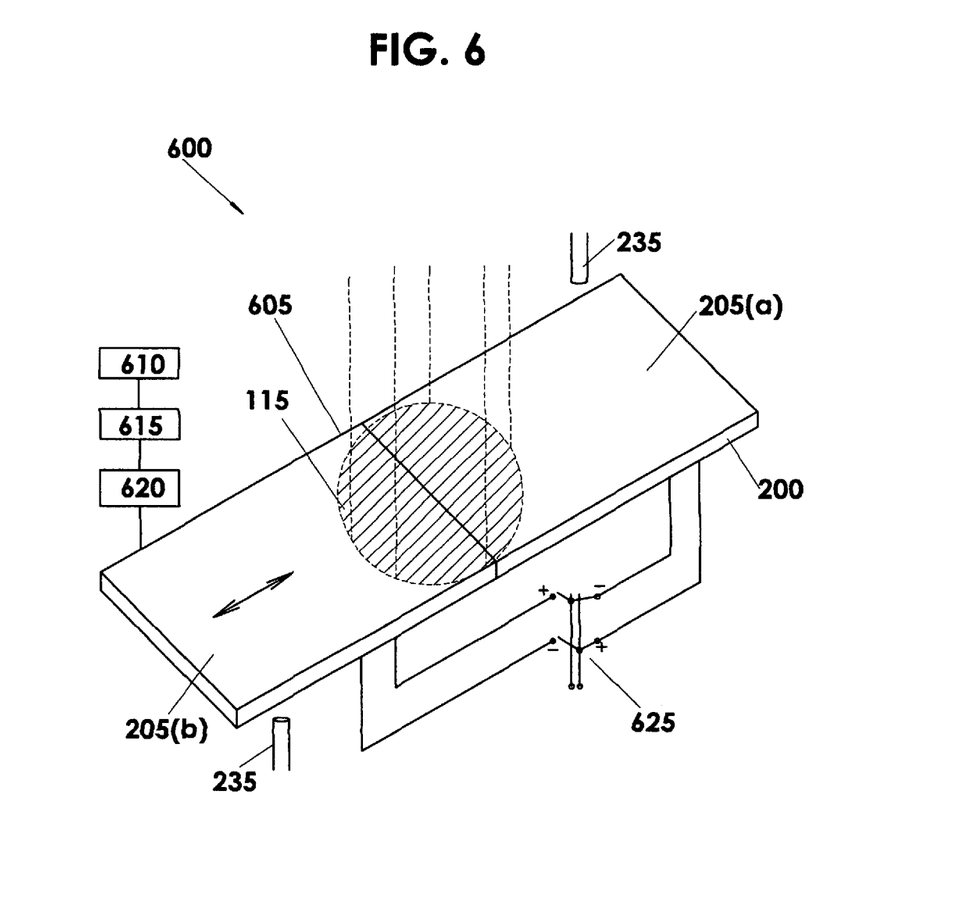
FIG. 6 shows an embodiment of the system for generating alternating current from concentrated sunlight with a lateral motion stage.

FIG. 6 shows another embodiment 600 of the system for generating alternating current from concentrated sunlight. Embodiment 600 may comprise the primary sunlight concentrator 105, the secondary sunlight concentrator 110, the aperture 120, the reflector 130, the hinge 135, and the optical homogenizer 140 as described in FIG. 1 through 4. Embodiment 600 may instead comprise the Fresnel lens 505 as with embodiment 500.

In lieu of the rotary solar AC generator 145, the embodiment 600 comprises a lateral motion stage 605, two or more concentrated photovoltaic cells 205(a) and 205(b) respectively, a motor power supply 610, a motor 615, a gearbox 620, and an alternating current collector and output connector 625.

The lateral motion stage 605 supports the two concentrated photovoltaic cells 205(a) and 205(b). Attached to the lateral motion stage 605 is a lateral driving mechanism comprising a motor power supply 610, a motor 615, and a gearbox 620. The motor power supply 610 supplies power to the motor 615. The motor power supply 610 may be a battery for an electrical motor. In some embodiments, the motor power supply 610 may be an alternative energy source, e.g., mechanical or electrical, for driving the motor 615, thus creating 'green (renewable) power'. The gearbox 620 may be used to adapt the speed and torque of the motor 615 for lateral movement of the lateral motion stage 605.

Each of the concentrated photovoltaic cells 205(a) and 205(b) is electrically connected to the alternating current collector and output connector 625. As the lateral motion stage 605 moves back and forth, the area illuminated by the concentrated sunlight 115 on any one concentrated photovoltaic cell 205(a) or 205(b) increases as the lateral motion stage approaches the end of travel, and decreases as the lateral motion stage approaches the middle. As described herein, the amplitude of the current generated varies proportionally to the area of the concentrated photovoltaic cell 205(a) or 205(b) exposed to the concentrated sunlight 115, while the net polarity is function of which of the concentrated photovoltaic cells 205(a) or 205(b) is receiving more of the concentrated sunlight 115. At the middle, equal areas of the two concentrated photovoltaic cells 205(a) and 205(b) are illuminated.

As the lateral motion stage 605 moves the concentrated photovoltaic cells 205(a) under the concentrated sunlight 115, the alternating current collector and output connector 625 collects the direct current from the concentrated photovoltaic cells 205(a) and outputs the varying current according to the polarity of its attachment to the alternating current collector and output connector 625. As shown in FIG. 6, one lead of concentrated photovoltaic cells 205(a) is the negative lead, and the other lead is the positive lead. The leads of concentrated photovoltaic cells 205(b), however, are oppositely connected, so the direction of the current output by the alternating current collector and output connector 625 alternates according to which concentrated photovoltaic cells 205(a) or 205(b) is currently receiving concentrated sunlight 115.

Consequently, as with the rotary solar AC generator 145, the lateral solar AC generator also generates alternating current. Furthermore, the frequency of the lateral movement of the lateral motion stage 605 may be adjusted to match the desired frequency of the resultant alternating current, such as 60 cycles per second, 50 cycles per second, or whatever frequency is desired.

Some embodiments may include the concentrated photovoltaic cell cooling system 235.

Figure 7:
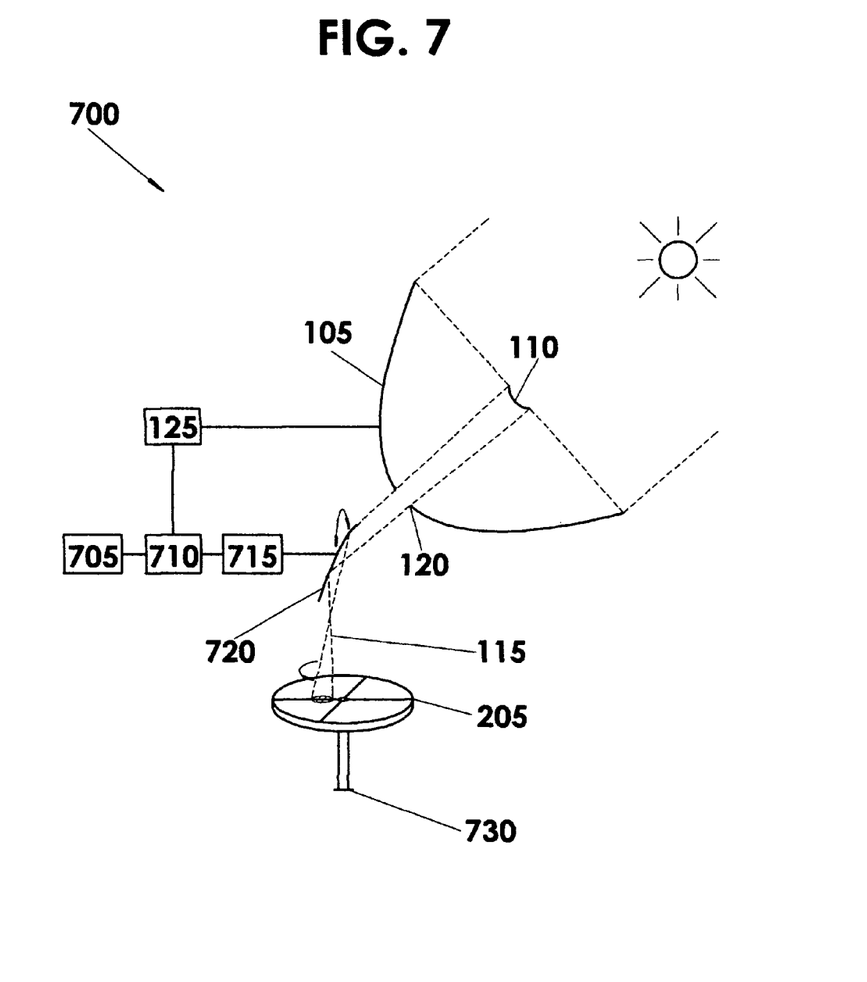
FIG. 7 shows an embodiment of the system for generating alternating current from concentrated sunlight with an open rotary motion stage and a rotating reflector.

FIG. 7 shows an embodiment 700 of the system for generating alternating current from concentrated sunlight with an open rotary motion stage and a rotating reflector. The embodiment 700 may comprise the primary sunlight concentrator 105, the secondary sunlight concentrator 110, the aperture 120, the solar tracker 125, a rotating reflector 720, the plurality of concentrated photovoltaic cells 205 and the alternating output connector 230. The embodiment 700 may further comprise a power supply 705, a motor 710 a gearbox 715, a rotating reflector 720, a stationary stage 725 and a stationary alternating current collector 730.

As in the other embodiments, the primary sunlight concentrator 105 concentrates the incoming sunlight by directing the incoming sunlight toward a common focal point. In some embodiments, a secondary light concentrator 110 is at the common focal point to receive the incoming sunlight. Although the secondary light concentrator 110 does not collimate the light, the secondary light concentrator 110 keeps the concentrated sunlight convergent and directs it toward aperture 120. The concentrated light 115 then exits the primary light concentrator 105 via aperture 120.

Tracking the sunlight is a solar tracker 125, which is connected to the primary light concentrator 105 to assure that the primary light concentrator 105 is optimally oriented at all times toward the sun. In one embodiment, the solar tracker 125 monitors both the azimuth and elevation of the sun with a dual axis motor system, continuously aligns the primary light concentrator 105 to directly face the sun. In some embodiments, the solar tracker 125 may be a single axis system. Other embodiments may simply track the sun without aligning the primary light concentrator 105, or omit the solar tracker 125.

After passing through the aperture 120, the concentrated light 115 strikes the rotating reflector 720. The rotating reflector 720 may comprise a high-power high-reflectivity mirror. The rotating reflector 720 may be flat or other shape. Attached to the rotating reflector 720 is the gearbox 715, which is driven by the motor 710, which is powered by the power supply 705. The motor power supply 705 may be a battery for an electrical motor. In some embodiments, the motor power supply 705 may be an alternative energy source, e.g., mechanical or electrical, for driving the motor 615, thus creating 'green (renewable) power'. The motor 710 and gearbox 715 are connected to the solar tracker 125 so that the rotating reflector 720 directs the concentrated sunlight 115 onto the plurality of concentrated photovoltaic cells 205 in a rotating sequential motion around the stationary stage 725.

As the concentrated sunlight 115 strikes each of the plurality of concentrated photovoltaic cells 205 in sequence, each concentrated photovoltaic cell 205 generates direct current according to its polarity in an amplitude proportional to the area of the concentrated photovoltaic cell illuminated. The stationary alternating current collector 730 collects and outputs this current. As the concentrated sunlight 115 rotates around the stationary stage 725, each concentrated photovoltaic cell generates direct current in an amplitude proportional to the area of the concentrated photovoltaic cell illuminated. As each adjacent concentrated photovoltaic cells 205 is inversely connected to the stationary alternating current collector 730, the resulting output is alternating current.

Although this embodiment lacks the optical homogenizer of some other embodiments, the solar energy concentration of the concentrated sunlight is about 500 suns. At this concentration, the electrical energy produced by the ambient (unconcentrated) sunlight is comparatively negligible.

FIGS. 8a, 8b, 8c, 8d and 8e show an embodiment of the system for generating three-phase alternating current from concentrated sunlight. The system for generating three-phase alternating current from concentrated sunlight operates in a manner similar to the one-phase alternating current embodiment, but may comprise a rotary table 800 for a plurality of six concentrated photovoltaic cells 205 (205(a), 205(b), 205(c), 205(d), 205(e), and 205(f)), a three-phase rotary electrical connector 805, and three pair of output connectors 810. Some embodiments may include the concentrated photovoltaic cell cooling system 235.

Figure 8A:
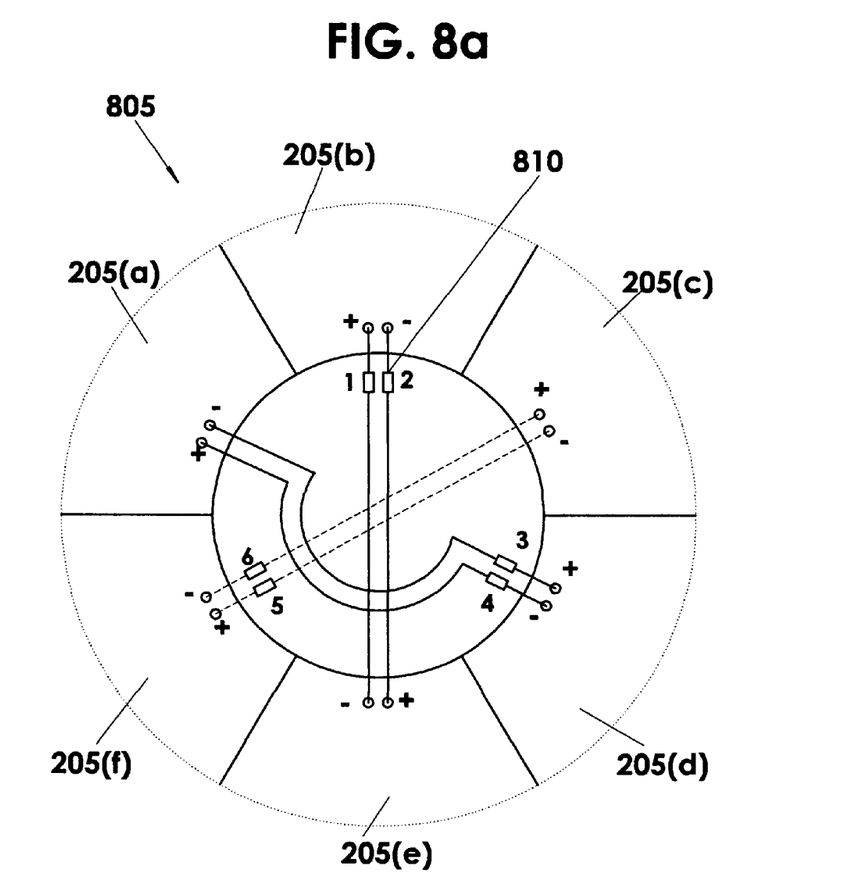
FIGS. 8a, 8b, 8c, 8d and 8e show an embodiment of the system for generating three-phase alternating current from concentrated sunlight.

As shown in FIG. 8a, the system for generating three-phase alternating current from concentrated sunlight differs from the one-phase system in that there are three pairs of leads to the three-phase rotary electrical connector 805. Similarly, although each of the six concentrated photovoltaic cells 205(a), 205(b), 205(c), 205(d), 205(e), and 205(f) have a positive output, the reversal of the terminal connections for concentrated photovoltaic cells 205(d), 205(e), and 205(f) results in a reversal of the current direction, i.e., a negative output from those concentrated photovoltaic cells.

Concentrated photovoltaic cells 205(b) and 205(e) comprise phase 1, but are connected in opposing output polarity to the same terminals. Concentrated photovoltaic cells 205(a) and 205(d) comprise phase 2, but are connected in opposing output polarity to the same terminals. Concentrated photovoltaic cells 205(t) and 205(c) comprise phase 3, but are connected in opposing output polarity to the same terminals.

Figure 8B:
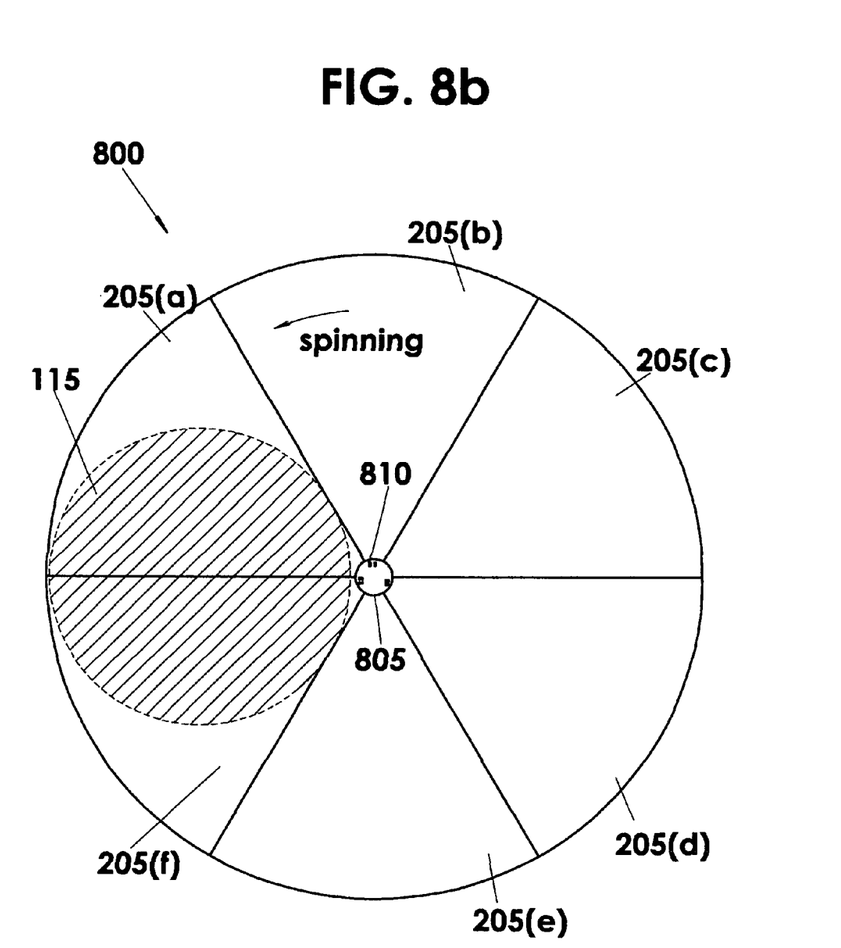

As shown in FIG. 8b, the concentrated sunlight is striking approximately of one-half of each of the concentrated photovoltaic cells 205(a) and 205(f). Consequently, as the rotary table 800 rotates, the concentrated sunlight 115 strikes a 120-degree arc on the rotary table 800 and the six concentrated photovoltaic cells 205(a), 205(b), 205(c), 205(d), 205(e), and 205(f).

As shown, concentrated photovoltaic cell 205(a) is outputting a net positive one-half full amplitude to the phase 2 lead, while concentrated photovoltaic cell 205(f) is outputting a net negative one-half full amplitude to the phase 3 lead at the three pair of output connectors 810. Concentrated photovoltaic cells 205(b) through (e) are at relatively near zero voltage and are thus negligible outputs.

Figure 8C:
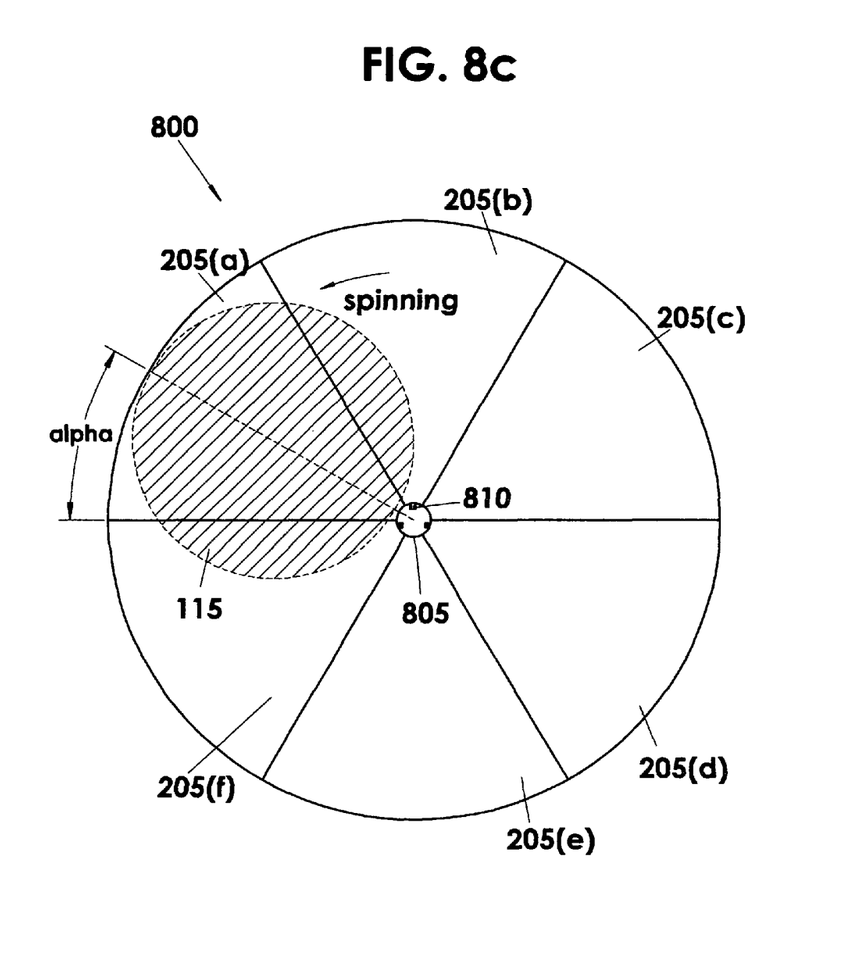

As shown in FIG. 8c, the rotating stage has brought the concentrated sunlight 115 to concentrated photovoltaic cells 205(f) (about one-quarter amplitude), 205(a) (approximately full amplitude) and 208(b) (about one-quarter amplitude). Consequently, concentrated photovoltaic cells 205(a) is at a net positive full amplitude to the phase 2 lead, concentrated photovoltaic cells 205(b) is at a net negative one-quarter full amplitude to the phase 1 lead, while concentrated photovoltaic cell 205(f) is outputting a net negative one-quarter full amplitude to the phase 3 lead at the three pair of output connectors 810. Concentrated photovoltaic cells 205(c) through (e) are at relatively near zero voltage and are thus negligible outputs.

Figure 8D:
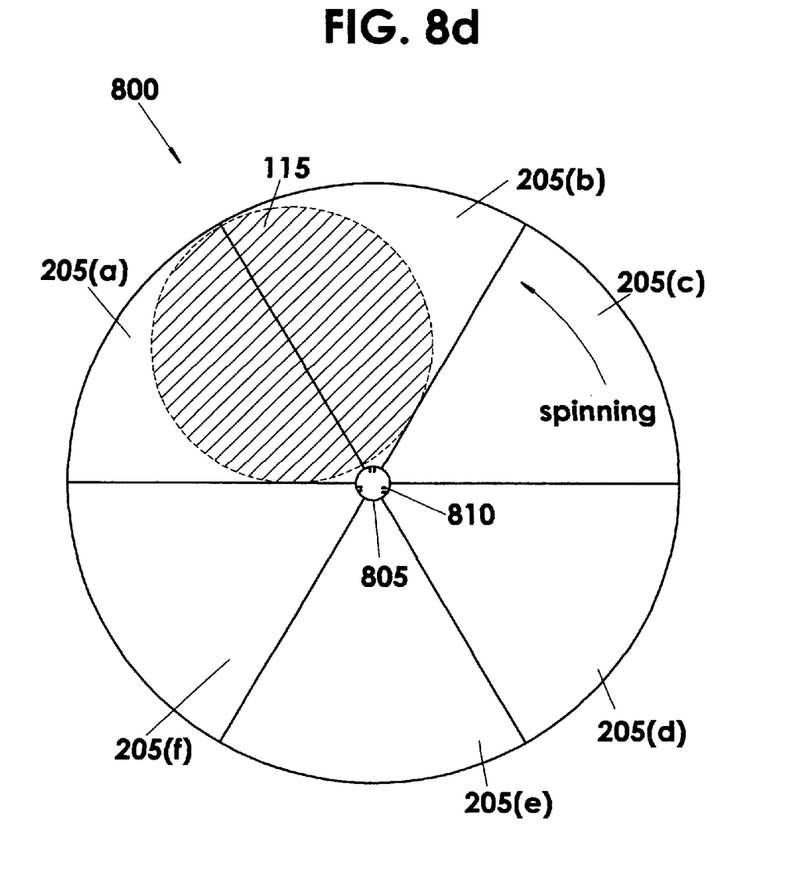

As shown in FIG. 8d, the rotating stage has brought the concentrated sunlight 115 to concentrated photovoltaic cells 205(a) (about one-half amplitude) and 205(b) (approximately one-half full amplitude). Concentrated photovoltaic cell 205(a) is again outputting a net positive one-half full amplitude to the phase 2 lead, while concentrated photovoltaic cell 205(b) is outputting a net negative one-half full amplitude to the phase 1 lead at the three pair of output connectors 810. Concentrated photovoltaic cells 205(c) through (f) are at relatively near zero voltage and are thus negligible outputs.

Figure 8E:
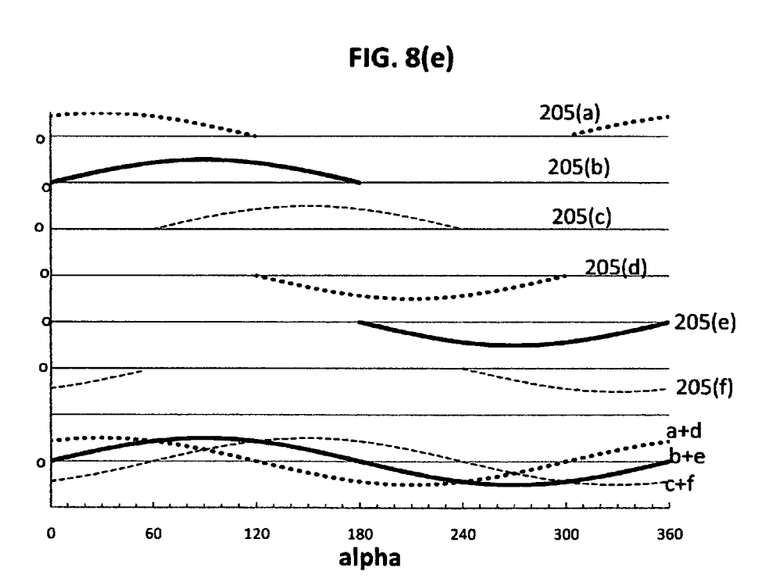

FIG. 8(e) shows the output of each solar cell and the resultant three-phase output as the concentrated sunshine 115 sequentially strikes the concentrated photovoltaic cells 205(a), 205(b), 205(c), 205(d), 205(e), and 205(f) as described above.

From zero degrees to 60 degrees, the concentrated photovoltaic cells 205(a) and 205(b) output positive current on phases 2 and 1 respectively, while the concentrated photovoltaic cell 205(f) outputs a current on phase 3. As the concentrated photovoltaic cell 205(f) is inversely connected to phase 3, however, the net current output on phase 3 is negative current.

From 60 degree to 120 degrees, the concentrated photovoltaic cells 205(a), 205(b) and 205(c) output positive current on phases 2, 1 and 3 respectively.

From 120 degree to 180 degrees, the concentrated photovoltaic cells 205(b) and 205(c) output positive current on phases 1 and 3, while the concentrated photovoltaic cell 205(d) outputs a current on phase 2. As the concentrated photovoltaic cell 205(d) is inversely connected to phase 2, however, the net current output on phase 2 is negative current.

From 180 degrees to 240 degrees, the concentrated photovoltaic cell 205(c) outputs positive current on phase 3, while the concentrated photovoltaic cells 205(d) and (205(e) output a current on phases 2 and 1. As the concentrated photovoltaic cells 205(d) and 205(e) are inversely connected to phases 2 and 1 respectively, the net current outputs on phases 2 and 1 are negative.

From 240 degrees to 300 degrees, the concentrated photovoltaic cells 205(d), 205(e) and 205(f) output current on phases 2, 1 and 3. As these concentrated photovoltaic cells are inversely connected to their phases, however, the net current outputs are negative current.

From 300 degrees to 360 degrees, the concentrated photovoltaic cells 205(a) outputs positive current on phase 2, while the concentrated photovoltaic cells 205(e) and 2059(f) output negative current on phases 1 and 3. As the concentrated photovoltaic cells 205(e) and 205(f) are inversely connected to phases 1 and 3 respectively, the net current outputs on phases 1 and 3 are negative.

Consequently, as the rotary table 800 rotates with the concentrated sunlight 115 striking a 120-degree arc, the system generates three-phase alternating current.

Figure 9:
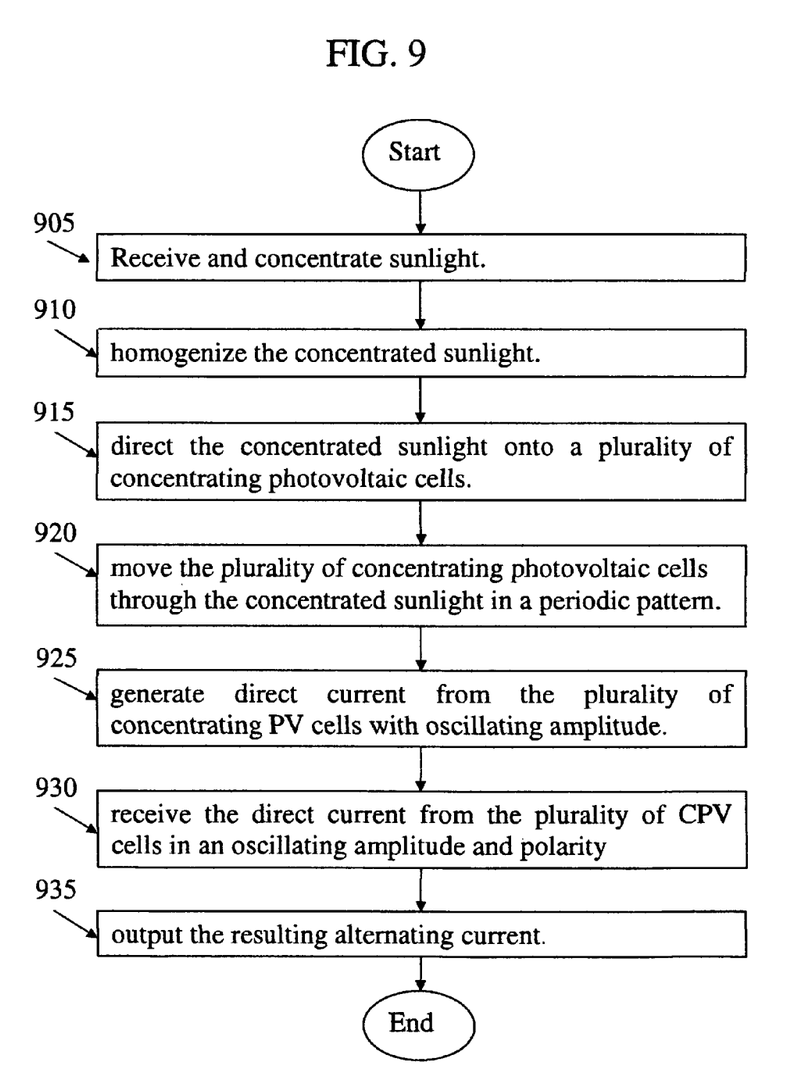
FIG. 9 shows a flowchart of a method for generating alternating current electricity from a solar power generation system.

FIG. 9 shows a flowchart of a method for generating alternating current electricity from a solar power generation system.

At step 905, sunlight is received and concentrated by a primary concentrator.

At step 910, the concentrated sunlight is homogenized.

At step 920, the homogenized sunlight is directed onto a plurality of concentrating photovoltaic cells.

At step 925, the plurality of concentrating photovoltaic cells is moved through the concentrated sunlight in a periodic pattern.

At step 930, direct current is generated from the plurality of concentrating photovoltaic cells.

At step 935, the direct current is received from the plurality of concentrating photovoltaic cells in an oscillating amplitude and polarity.

At step 940, the resulting alternating current is output.

The embodiments discussed here are illustrative of the present invention. Elements in the figures are illustrated for simplicity and clarity and are not drawn to scale. Some elements may be exaggerated to improve the understanding of various embodiments. The descriptions and illustrations, as well as the various modifications or adaptations of the methods and/or specific structures described are within the spirit and scope of the present invention. Hence, these descriptions and drawings should not be considered in a limiting sense, as it is understood that the present invention is in no way limited to only the embodiments illustrated.

What is claimed is:

1. A solar power generation system for generating alternating current electricity comprising:
    a sunlight concentrator for producing concentrated sunlight
    a solar tracking system for aligning the sunlight concentrator towards the sun;
    an optical homogenizer for homogenizing the concentrated sunlight and directing the concentrated sunlight onto a plurality of concentrating photovoltaic cells;
    a plurality of concentrating photovoltaic cells for generating direct current from the plurality of concentrating photovoltaic cells;
    a motion stage for moving the plurality of concentrating photovoltaic cells through the concentrated sunlight in a periodic pattern; and
    an electrical connector for receiving the direct current from the plurality of concentrating photovoltaic cells in an oscillating amplitude and polarity; and
    an alternating current connector for outputting the resulting alternating current.

2. The solar power generation system for generating alternating current electricity of claim 1 wherein the solar tracking system is azimuth-tracking and elevation-tracking.

3. The solar power generation system for generating alternating current electricity of claim 1 wherein the solar tracking system is azimuth-tracking.

4. The solar power generation system for generating alternating current electricity of claim 1 wherein the sunlight concentrator comprises a parabolic dish.

5. The solar power generation system for generating alternating current electricity of claim 1 wherein the sunlight concentrator comprises a Fresnel lens.

6. The solar power generation system for generating alternating current electricity of claim 1 wherein the motion stage rotates.

7. The solar power generation system for generating alternating current electricity of claim 1 wherein the motion stage alternates in lateral travel.

8. The solar power generation system for generating alternating current electricity of claim 1 wherein the plurality of concentrating photovoltaic cells comprises at least two concentrating photovoltaic cells for generating one-phase alternating current.

9. The solar power generation system for generating alternating current electricity of claim 1 wherein the plurality of concentrating photovoltaic cells comprises at least four concentrating photovoltaic cells paired across from each other on a rotary stage for generating two-phase alternating current.

10. The solar power generation system for generating alternating current electricity of claim 1 wherein the plurality of concentrating photovoltaic cells comprises at least six concentrating photovoltaic cells paired across from each other on a rotary stage for generating three-phase alternating current.

11. The solar power generation system for generating alternating current electricity of claim 1 wherein the electrical connector for receiving the direct current from the plurality of concentrating photovoltaic cells in an oscillating amplitude and polarity comprises a two-prong rotary connector.

12. The solar power generation system for generating alternating current electricity of claim 1 wherein the electrical connector for receiving the direct current from the plurality of concentrating photovoltaic cells in an oscillating amplitude and polarity comprises a six-contact lateral-travel connector.

13. The solar power generation system for generating alternating current electricity of claim 1 further comprising a cooling system to cool the plurality of concentrating photovoltaic cells.

* * * * *